(12) United States Patent
Wu

(10) Patent No.: US 7,641,071 B2
(45) Date of Patent: Jan. 5, 2010

(54) FASTENING STRUCTURE OF CLEAN CONTAINER

(75) Inventor: Tzong-Ming Wu, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 249 days.

(21) Appl. No.: 12/000,398

(22) Filed: Dec. 12, 2007

(65) Prior Publication Data

US 2008/0149653 A1 Jun. 26, 2008

(30) Foreign Application Priority Data

Dec. 22, 2006 (TW) ............... 95148654 A

(51) Int. Cl.
*B65D 41/16* (2006.01)
*B65D 45/16* (2006.01)
*B65D 85/30* (2006.01)

(52) U.S. Cl. .............. 220/786; 206/710; 220/788; 220/326

(58) Field of Classification Search ........... 220/786, 220/788, 326; 206/710
See application file for complete search history.

(56) References Cited

U.S. PATENT DOCUMENTS

| | | | | |
|---|---|---|---|---|
| 4,344,646 A | * | 8/1982 | Michel | ............ 292/87 |
| 4,709,834 A | * | 12/1987 | Mortensen et al. | .......... 220/326 |
| 4,804,086 A | * | 2/1989 | Grohrock | ............ 206/710 |
| 6,513,654 B2 | * | 2/2003 | Smith et al. | ............ 206/454 |
| 6,612,625 B1 | * | 9/2003 | Barber et al. | ............ 292/87 |
| 7,108,135 B2 | * | 9/2006 | Park | ............ 206/711 |
| 7,182,203 B2 | * | 2/2007 | Burns et al. | ............ 206/710 |
| 7,325,698 B2 | * | 2/2008 | Halbmaier | ............ 220/326 |
| 2004/0004704 A1 | | 1/2004 | Wiseman et al. | |
| 2006/0076264 A1 | * | 4/2006 | CletusWittman | ............ 206/710 |
| 2006/0138143 A1 | * | 6/2006 | Matsutori et al. | ............ 220/323 |

* cited by examiner

*Primary Examiner*—Anthony Stashick
*Assistant Examiner*—Niki M Eloshway
(74) *Attorney, Agent, or Firm*—Rabin & Berdo, P.C.

(57) ABSTRACT

A fastening structure of a clean container is combined on a cover of the clean container with a dismountable fastener member, such that the cover is closed or opened on a base of the clean container. The fastener member includes a body, a positioning portion, and an elastic fastening arm, that are one-piece formed. The positioning portion extends from one side of the body to form a flat spring. A flange is formed on the flat spring to fasten the fastener member on the cover. The elastic fastening arm has an elastic arm, and a lateral flange is formed on one end of the elastic arm, and extends into the base to be buckled. The fastener member further includes an elastic auxiliary arm formed between the elastic arm and the body, so as to increase an elastic strength of the elastic fastening arm.

21 Claims, 10 Drawing Sheets

FASTENING STRUCTURE OF CLEAN CONTAINER

CROSS-REFERENCE TO RELATED APPLICATIONS

This non-provisional application claims priority under 35 U.S.C. § 119(a) on Patent Application No(s). 095148654 filed in Taiwan, R.O.C. on Dec. 22, 2006, the entire contents of which are hereby incorporated by reference.

BACKGROUND OF THE INVENTION

1. Field of Invention

The present invention relates to a fastening structure of a container, and more particularly, to a self-locking fastening structure of a clean container applied in a clean room.

2. Related Art

To clean containers, such as mask storage boxes, reticle storage boxes, wafer storage boxes, or glass substrate storage boxes, masks, reticles, wafers, or glass substrates are usually placed therein, so as to meet the strigent requirements on an ultra-clean storage environment for accommodating the masks, reticles, wafers, or glass substrates used in a semiconductor or a flat panel display process, and to strictly prevent the masks, reticles, wafers, or glass substrates from being contaminated by particles and affected by electrostatic charges and electrostatic fields. Currently, the semiconductor process requires Class 1 or better than Class 1 environment. Therefore, in a common semiconductor manufacturing fab. or flat panel display manufacturing plant, the masks, reticles, wafers, or glass substrates must be processed in an ultra-clean environment. The clean containers are used to transfer, load and unload, and store the masks, reticles, wafers, or glass substrates during a semiconductor process or a flat panel display process, so as to ensure that the masks, reticles, wafers, or glass substrates are in an environment meeting the ultra-clean process requirements.

A reticle box is taken as an example below. FIG. 1A is an exploded isometric view of a reticle box in U.S. Patent Publication No. 2004/0004704. The reticle box 10 includes a base 11 and a top cover 12 covered on the base 11. A groove 122 is formed in each of two opposite side faces 121 of the top cover 12, and an elastic piece 13 is accommodated in each of the grooves 122. Each of the elastic pieces 13 includes two elastic arms 131, and a flange 133 protrudes on a front part of each of the elastic arms 131, which can be engaged into a lateral groove 111 formed in the base 11, so as to fasten the top cover 12 on the base 11.

However, the conventional elastic pieces 13 are received in the grooves 122 respectively, and in order to prevent the elastic pieces 13 from dropping out, additional retaining plates 14 must be disposed to fix the elastic pieces 13 in the grooves 122. However, according to this design, because the force arm of the elastic arms 131 are long, and the torque endured by supporting points is large, when the elastic arm 131 is opened and closed repeatedly, and is easily broken or bent due to fatigue, thereby losing the function, the elastic pieces 13 must be replaced as a whole. Furthermore, each of the elastic pieces 13 needs a retaining plate 14 to prevent it from dropping out. As a result, not only the particles will easily deposit in the dead angles between the elastic pieces 13 and the retaining plates 14, but also the operation of cleansing and drying the reticle box 10 cannot be performed smoothly.

In addition, FIG. 1B shows another reticle box according to another prior art, and FIG. 1C is a partial enlarged view of Part A in FIG. 1B. In this prior art, a metal spring 16 provides a thrust force to fasten a fastener member 15, and a metal cover plate 17 is further provided, so as to not only support the spindle rotation of the fastener member 15, but also prevent relevant fastening components from dropping out. The metal spring 16 and the metal cover plate 17 may have rust and generate metal particles when contacting acidic/alkaline gases and DI Water. Similar to the prior art shown in FIG. 1A, not only the particles will easily deposit in the dead angles between the fastening member and the metal cover plate, but also the operation of cleansing and drying the reticle box cannot be performed smoothly. Moreover, in this prior art, the number of the parts will also be increased (14 parts are used in the fastener mechanism in total), so this prior art is not so perfect.

SUMMARY OF THE INVENTION

In view of the disadvantages in the prior arts, the present invention is directed to providing a fastening structure. In the present invention, the number of fastening components is decreased, the fastening structure can be directly positioned on a cover, and self-locked after being fastened onto a base, and the fastening structure of a clean container of elastic components is reinforced.

In order to achieve the object of decreasing the number of fastening components and forming a self-locked fastening structure after the self-locking, the present invention provides a fastening structure of a clean container, which is removably mounted on a cover of the clean container through at least one fastener member, such that the cover may be closed or opened on a base of the clean container. At least one groove is formed in a side face of an outer frame of the base. Each of the side faces of the cover has an internal plate and an external plate extending outwards, so as to cover the outer frame of the base. At least one accommodation groove is formed between the internal plate and the external plate to enable the fastener member to be engaged therein. A hole corresponding to the groove is formed in the internal plate of the accommodation groove, and a positioning hole and a socket corresponding to the hole are formed in the external plate of the accommodation groove. The fastener member includes a body, a positioning portion, and an elastic fastening arm that are one-piece formed. The body can be an approximately U-shaped frame body. The positioning portion is formed on one side of the body, and has a flat spring tilting outwards. The flat spring has a flange, which is corresponding to the positioning hole and is buckled to the positioning hole. The elastic fastening arm is formed on another side of the body, and has an elastic arm and a drawing block formed at one end of the elastic arm. The drawing block has a lateral flange, which passes through the hole to extend into the groove, such that a top surface of the lateral flange is buckled to an inner top surface of the groove.

In order to solve the aforementioned problem of reinforcing the elastic components, the present invention further includes an elastic auxiliary arm formed between the elastic arm and the body. At least one end of the elastic auxiliary arm is connected to the elastic arm or the body in a perpendicular or inclined direction.

In the aforementioned embodiment, the elastic auxiliary arm can further include a first support arm and a second support arm. The first support arm or the second support arm is arc-shaped, or both of the first and second support arms are arc-shaped.

In the aforementioned embodiment, at least one bump can be added onto the top surface of the lateral flange, so as to reduce a contact area when the lateral flange and the groove of the base are fastened.

In the aforementioned embodiment, in order to make the fastener member on the cover be fastened to the base more firmly and automatically, the inner top surface of the groove of the base can be a bevel face that becomes higher from outside to inside, such that an opening sectional area of the groove is small, and an inner sectional area of the groove is large. The top surface of the lateral flange is also changed to be a corresponding bevel face, such that after the lateral flange is buckled in the groove, a large frictional force is formed between the two bevel faces in a movement direction along which the locked state is released, so as to form the self-locking.

As for further improvement of the aforementioned embodiment, at least one engaging structure is further disposed on the internal top surface of the groove in the horizontal face or the bevel face and the top surface of the lateral flange. The engaging structure can include at least one bump disposed on the top surface and at least one corresponding recess formed in the inner top surface, or at least one recess formed in the top surface and at least one corresponding bump disposed on the inner top surface.

As for further improvement of the aforementioned embodiment, in order to fasten the fastener member to the accommodation groove in the cover more firmly, the accommodation groove further includes at least one positioning rib, so as to engage and position the approximately U-shaped frame body, and the approximately U-shaped frame body further includes at least one rib tube, through which the positioning rib passes.

The effects obtained after this embodiment of the present invention are as follows. The fastening structure of the cover and base of the clean container of the present invention is directly engaged and fixed on the cover through one-piece formed ratchets of the flat spring of the fastener member, which is different from the prior art that uses the retaining plate to fix the fastener member, such that the number of the parts is reduced, the particle-depositing dead angles are reduced, and the cleansing and drying process can be performed easily. The present invention utilizes the elastic fastening arm and the elastic auxiliary arm to enhance the fastening elastic strength, so as to overcome the problem in the prior art that the long fastening arms of force or the metal springs are easy to be out of work due to fatigue. As the fatigue is prevented, and no metal elements are used, the fastening reliability and cleanliness are well improved. The present invention utilizes the design of the bump on the top surface of the lateral flange of the fastener member, so as to reduce the contact area of the elements in the relative movement between the lateral flange and the groove of the base when fastening or releasing, thereby reducing the frictional force and avoid the generation of particles. The engaging structure further disposed on the contact surface of the lateral flange and the groove of the base, or the design making the contact surface form a self-locking bevel face can further provide more stable and self-fastening functions in fastening, so as to prevent the fastening structure from becoming loose when being impacted, and ensuring the locking of the clean container.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The preferred embodiments of the present invention are illustrated in detail with reference to the accompanied drawings.

Figure 1A:
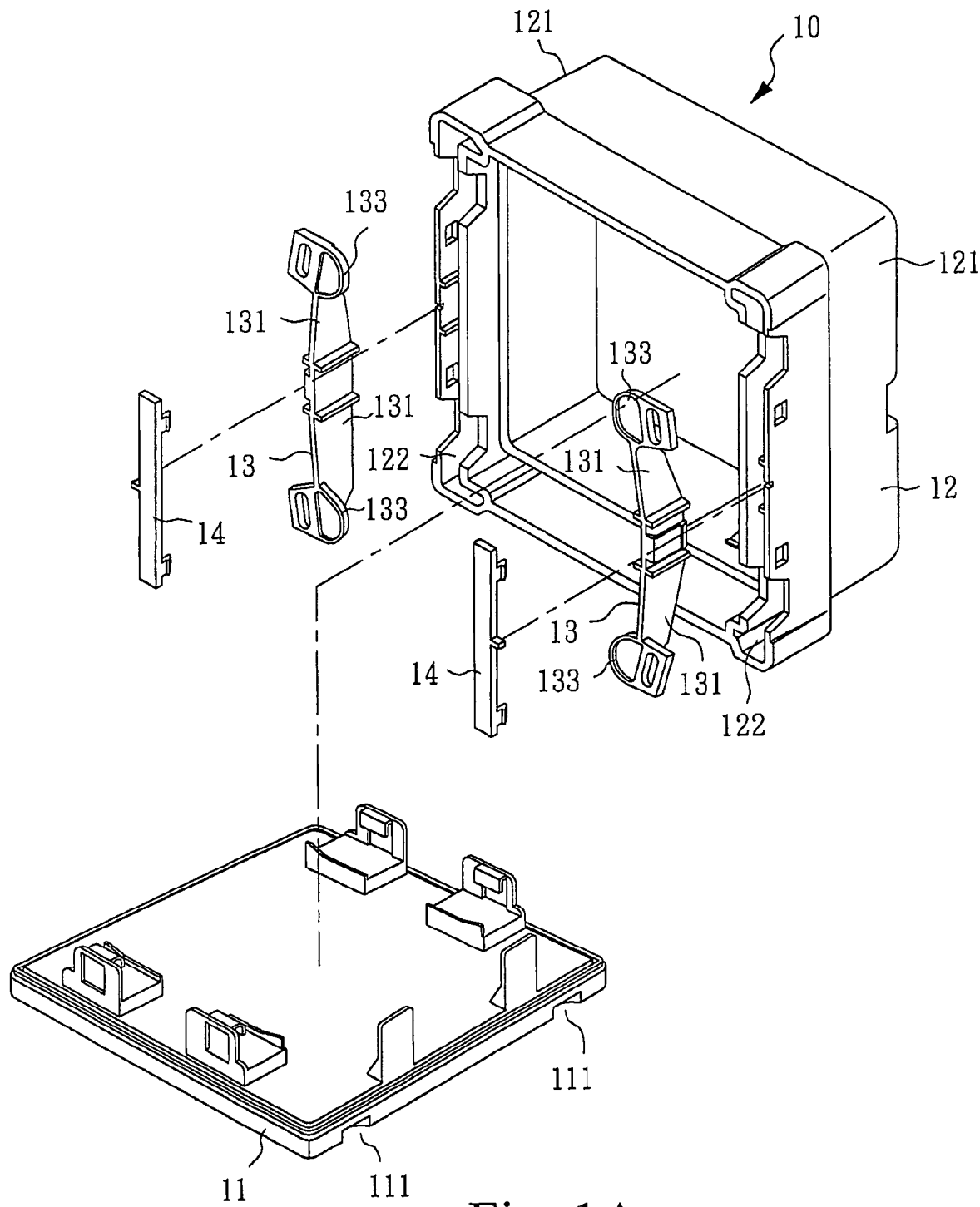
FIG. 1A is an exploded isometric view of the reticle box in a prior art.
Figure 1B:
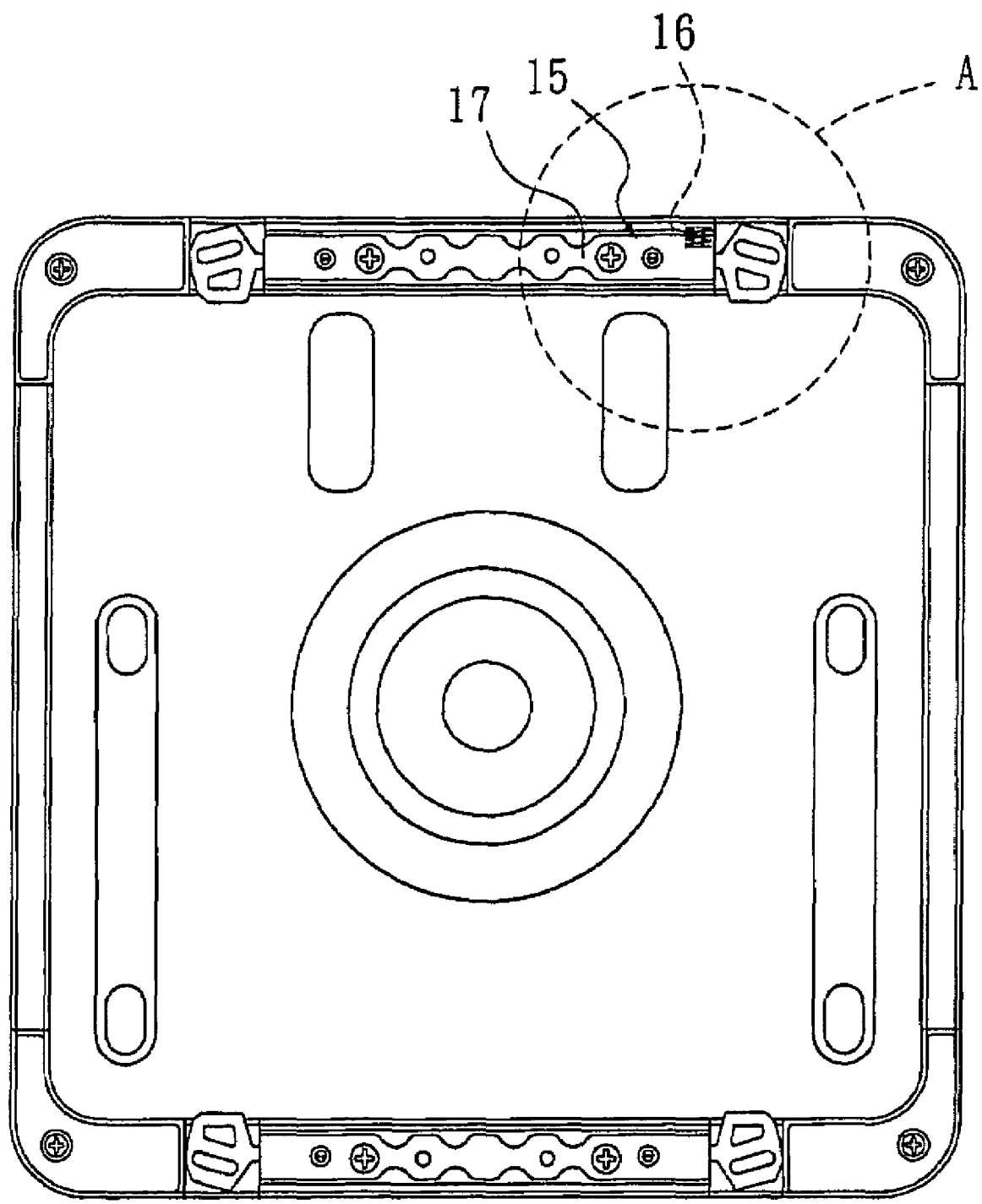
FIG. 1B is a bottom view of the top cover of the reticle box in another prior art.
Figure 1C:
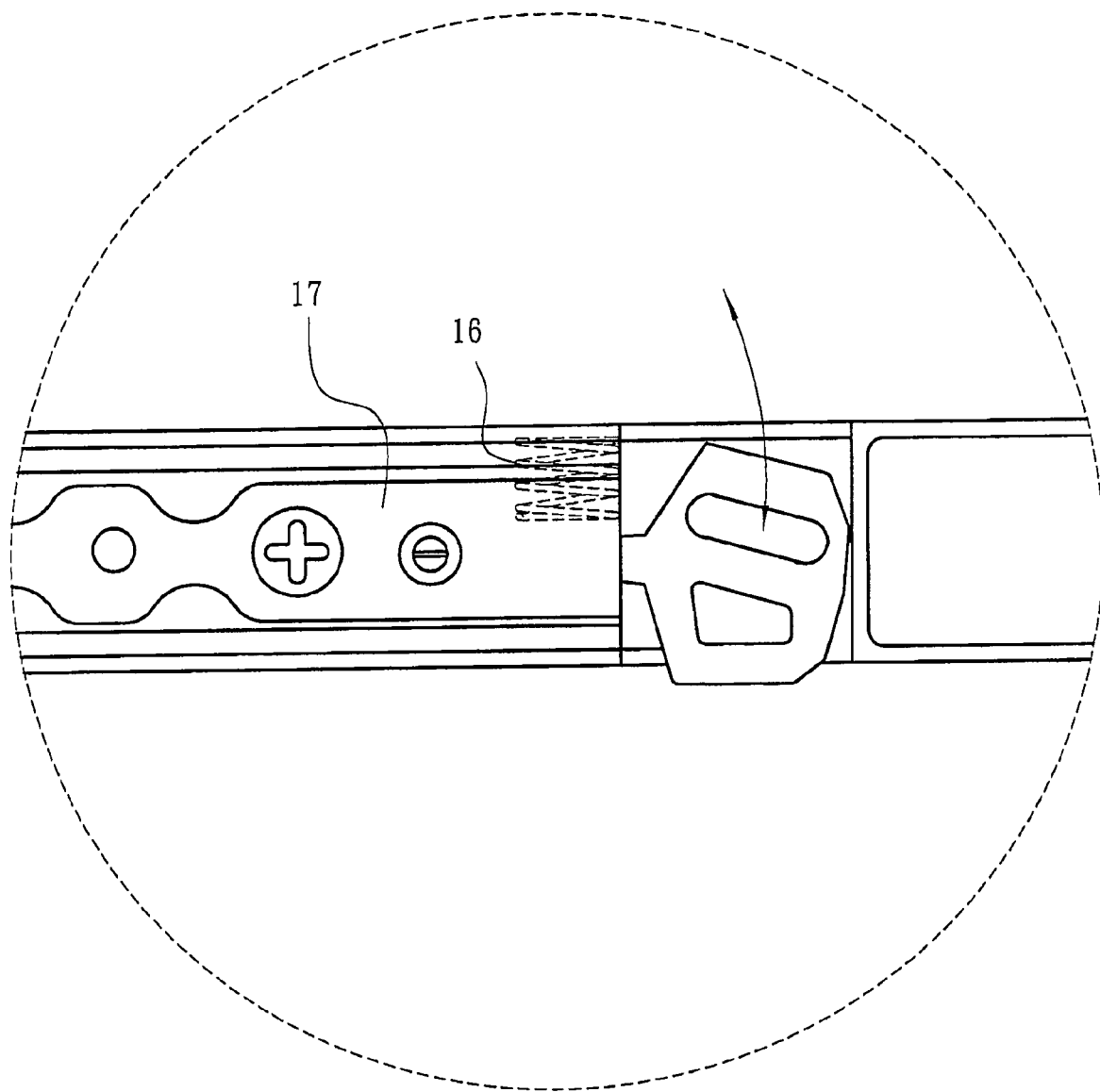
FIG. 1C is a partial enlarged view of Part A in FIG. 1B.
Figure 2:
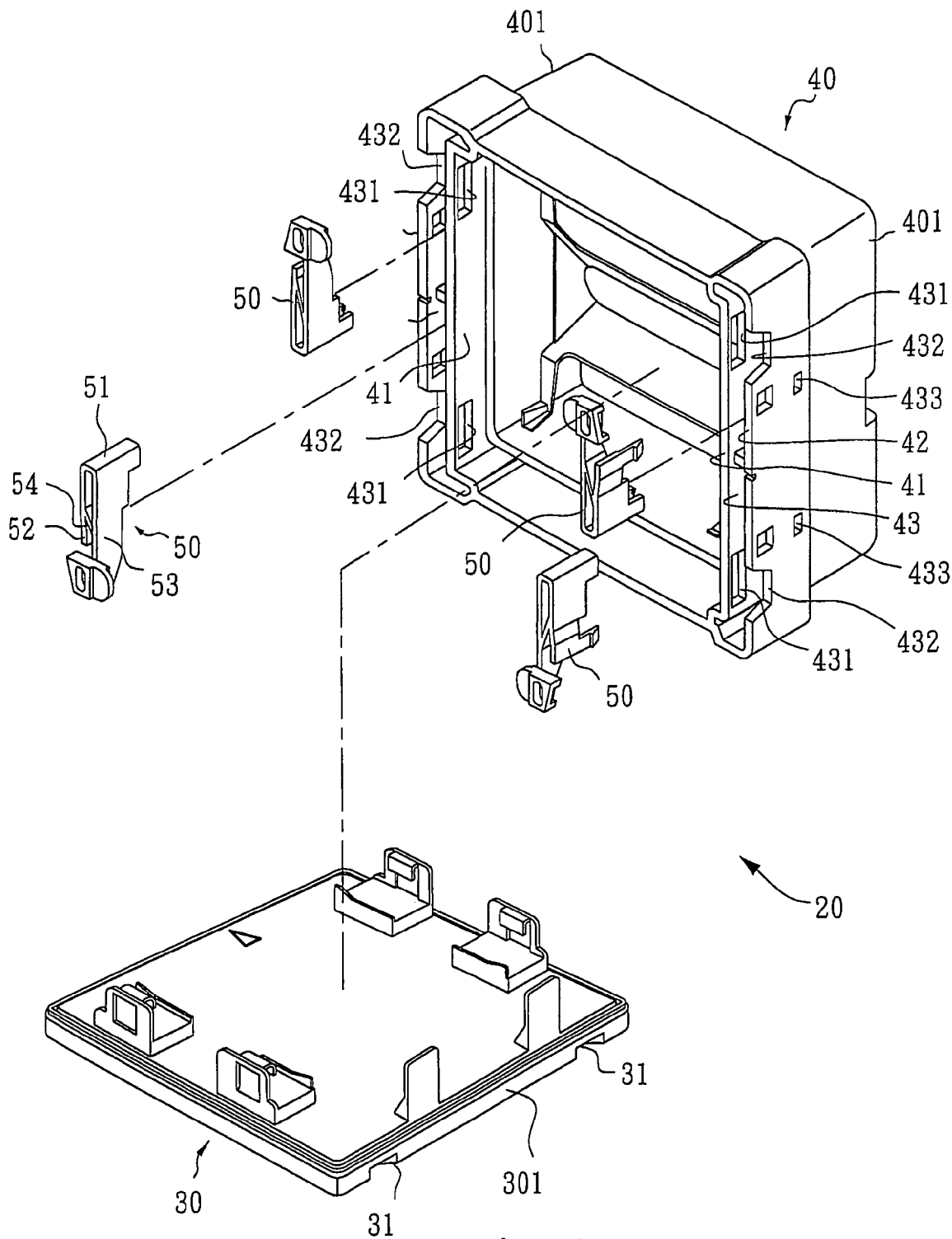
FIG. 2 is an exploded isometric view of an embodiment of the fastening structure of the clean container according to the present invention.
Figure 3:
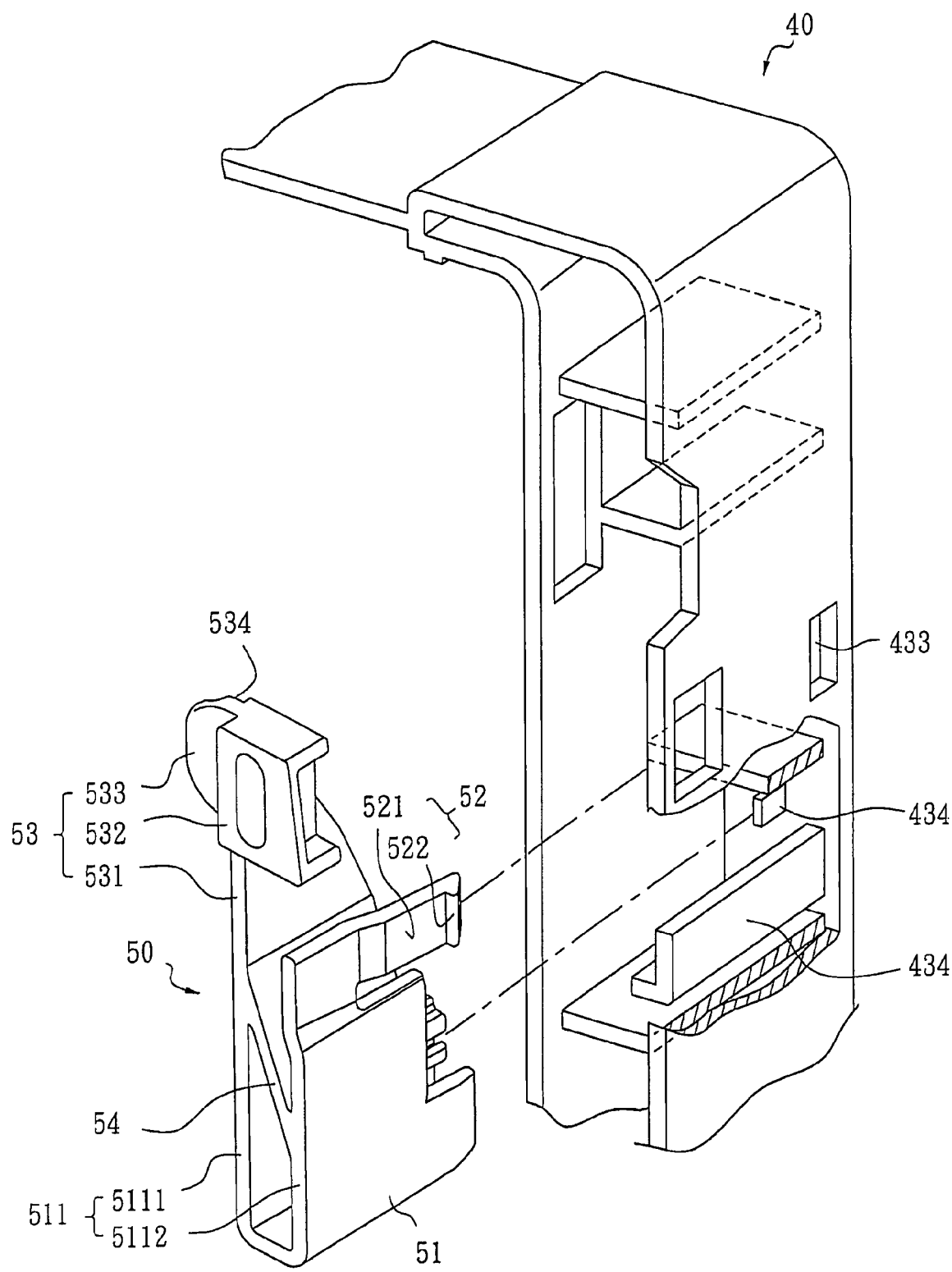
FIG. 3 is an exploded isometric view of the accommodation groove of the cover and the fastener member in FIG. 2.
Figure 4:
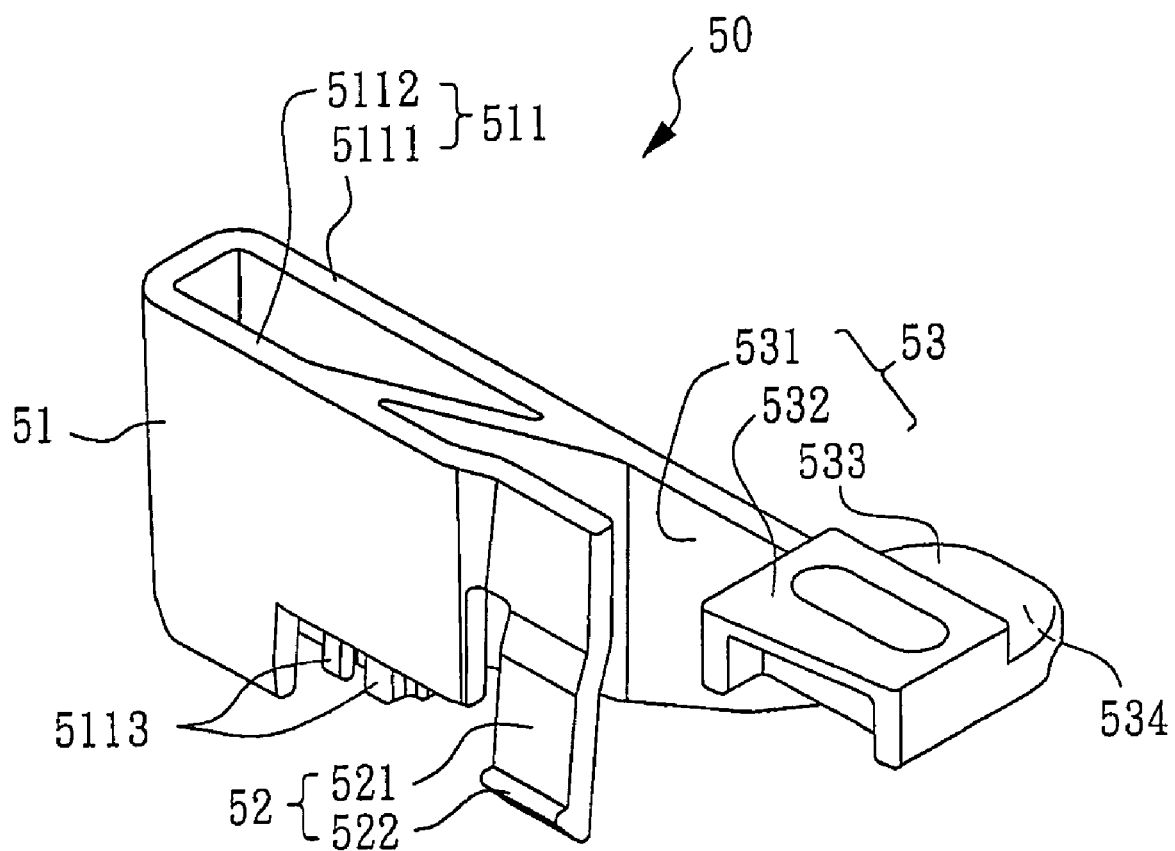
FIG. 4 is an isometric view of a first embodiment of the fastener member and the elastic auxiliary arm of the fastening structure of the clean container according to the present invention.

Firstly, FIG. 2 is an exploded isometric view of an embodiment of the fastening structure of the clean container according to the present invention; FIG. 3 is an exploded isometric view of the fastener member and the accommodation groove of the cover in FIG. 2; and FIG. 4 is an isometric view of the fastener member and the elastic auxiliary arm of the fastening structure of the clean container according to a first embodiment of the present invention. The fastening structure of the clean container 20 in this embodiment of the present invention uses one or more fastener members 50, so as to be engaged removably and combined to a cover 40 of the clean container, such that the cover 40 can be fastened or opened on the base 30 of the clean container. The side face 301 of the outer frame of the base 30 has grooves 31 according to the number of the fastener members 50, a side face 401 of the cover 40 has an internal plate 41 and an external plate 42 extending outwards, so as to cover the outer frame of the base 30. At least one accommodation groove 43 is formed between the internal plate 41 and the external plate 42, so as to engage the fastener member 50. A hole 431 corresponding to the groove 31 is formed in the internal plate 41 in the inside face in the accommodation groove 43. A positioning hole 433 and a socket 432 corresponding to the hole 431 are formed in the external plate 42 of the accommodation groove 43. The fastener member 50 includes a body 51, a positioning portion 52, an elastic fastening arm 53, and an elastic auxiliary arm 54 that are one-piece formed. The body 51 can be an approximately U-shaped frame body 511, and has a first frame 5111 and a second frame 5112. A positioning portion 52 extends from the second frame 5112, and has a flat spring 521 tilting outwards. A flange 522 is disposed on the flat spring 521, which preferably is formed of ratchets. The flange 522 is corresponding to the positioning hole 433 and is buckled with it, so as to fix the fastener member 50 onto the cover 40. The elastic fastening arm 53 is formed on the first frame 5111 of the body 51, and has an elastic arm 531. One end of the elastic arm 531 has a drawing block 532, which has a lateral flange 533 passing through the hole 431 to extend into the groove 31, such that a top surface 534 of the lateral flange 533 and the inner top surface 311 of the groove 31 contacting the lateral flange 533 are buckled together.

In order to make the body 51 of the approximately U-shaped body frame body 511 joint with the accommodation groove 43 of the cover 40 more closely, a positioning rib 434 can be formed on the bottom of the accommodation groove 43, which passes through the first frame 5111 and the second frame 5112 of the approximately U-shaped frame body 511, or a rib tube 5113 is disposed on the approximately U-shaped frame body 511 to accommodate the positioning rib 434, so as to enhance the firmness and the torsional resistance of the fastener member 50.

Figure 5:
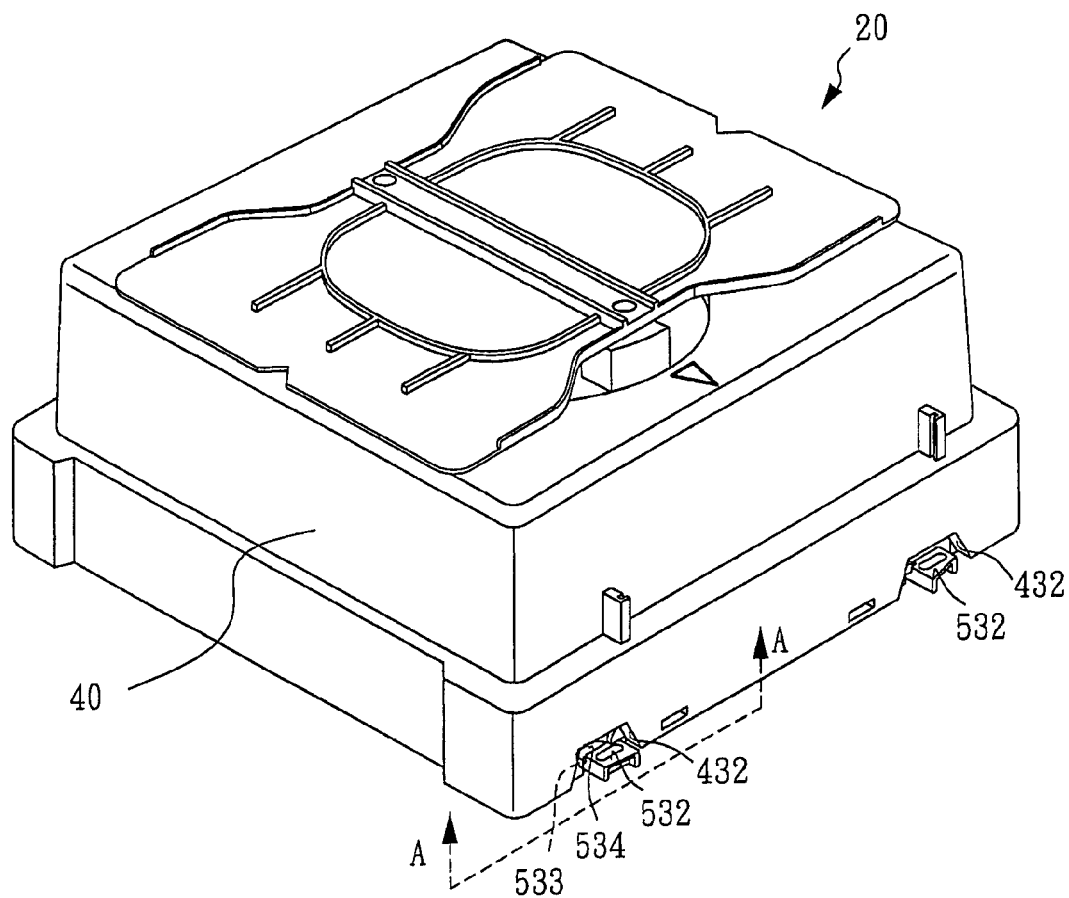
FIG. 5 is a combined isometric view of the embodiment of the fastening structure of the clean container according to the present invention.
Figure 6:
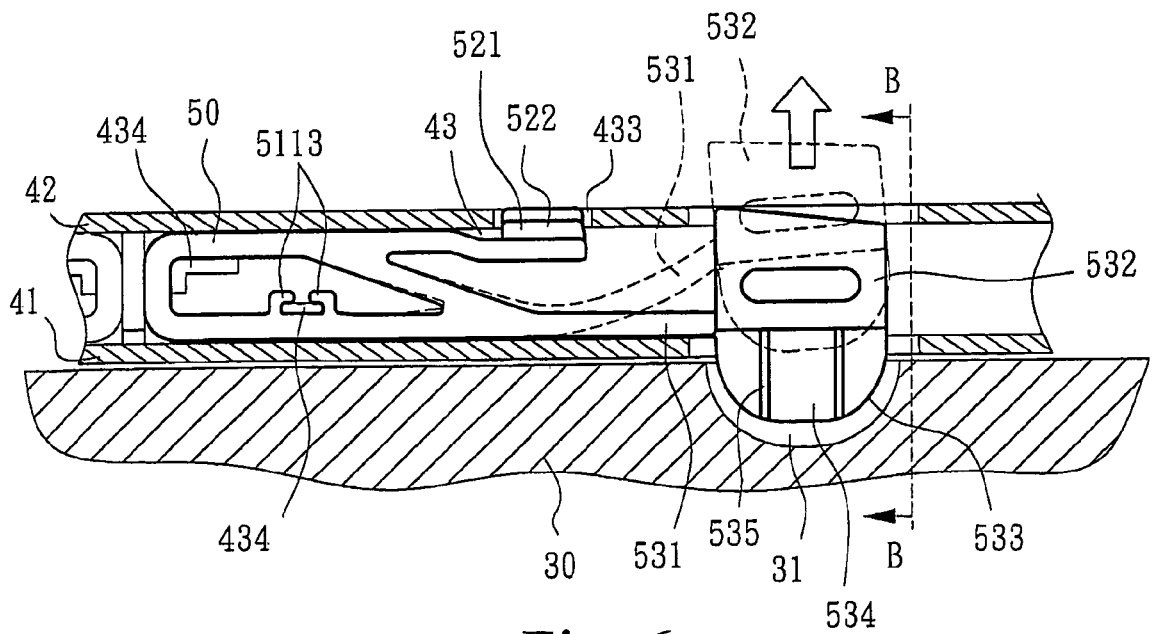
FIG. 6 is a schematic removed sectional view taken along Line A-A in FIG. 5.

FIG. 5 is a combined isometric view of an embodiment of the fastening structure of the clean container according to the present invention, and FIG. 6 is a schematic removed sectional view taken along Line A-A in FIG. 5. According to the aforementioned embodiment, the fastening structure of the clean container 20 firstly joints the fastener member 50 and the cover 40. Firstly, the body 51 is engaged into the accommodation groove 43. As the lateral flange 533 protrudes from the external plate 42, during the engaging process, the lateral flange 533 is blocked by the internal plate 41. At this point, the drawing block 532 is drawn outward by an external force, and due to the bending characteristic of the elastic arm 531, the lateral flange 533 does not contact the internal plate 41. At this time, the fastener member 50 can be directly engaged. The spreading flat spring 521 of the positioning portion 52 forms a reacting force after being engaged, such that the flange 522 is fixed by the positioning hole 433 tightly. Afterwards, once the external force on the drawing block 532 is released, the lateral flange 533 restores the original state to pass through the hole 431, thereby extending outside the internal plate 41.

In addition, when the cover 40 covers the base 30, each of the drawing blocks 532 jointed with the fastener member 50 of the cover 40 is drawn outward simultaneously by an external force. At this time, due to the direction of the external force applied on the drawing blocks 532, the fastener member 50 is under stress to deviate toward the outside, and the deviation direction just makes the flange 522 on the flat spring 521 of the positioning portion 52 be deeply engaged in the positioning hole 433, such that when the elastic fastening arm 53 is opened, the locking force of the fastener member 50 is further increased, and the fastener member 50 is not easy to be separated from the cover 40.

After all the lateral flanges 533 exit from the internal plate 41 of the cover 40 in response to the drawing of the drawing blocks 532 (when moving laterally to the outside, the drawing blocks 532 can move in and out the socket 432), the base 30 is aligned and moved in (or the cover 40 is moved to the base 30), such that the groove 31 is aligned with the hole 431. When the external force is released, the lateral flange 533 passes through the hole 431 to enter the groove 31, such that the base 30 and the cover are fastened together.

Figure 7:
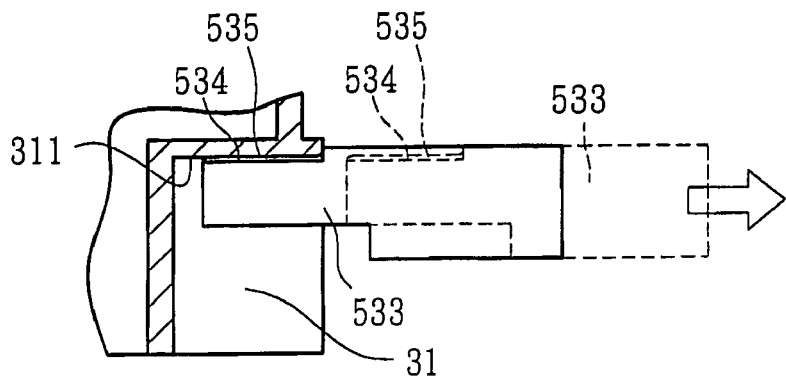
FIG. 7 is a schematic removed sectional view taken along Line B-B in FIG. 6.

With regard to the buckling structure of the lateral flange 533 and the groove 31, it still can be further improved (see FIG. 7, which is a schematic removed sectional view taken along Line B-B in FIG. 6). Additionally, at least one rib 535 is disposed on the top surface 534 of the lateral flange 533, such that only the rib 535 contacts the inner top surface 311 of the groove 31, thereby reducing the friction force to the relative movement and fine particles generated by friction.

Figure 8:
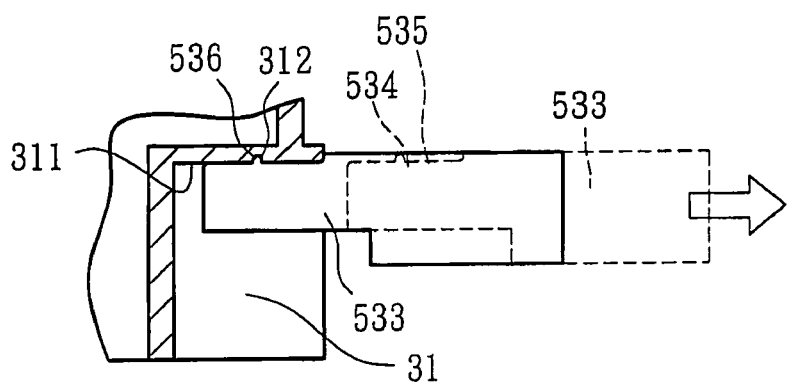
FIG. 8 is a schematic view of fastening the lateral flange and the engaging structure of the groove in the fastening structure of the clean container according to the present invention.

FIG. 8 is a schematic view of fastening the lateral flange and the engaging structure of the groove of the fastening structure of the clean container according to an embodiment of the present invention. An engaging structure can be disposed on the top surface 534 of the lateral flange 533, so as to further increase the jointing force of the lateral flange 533 and the groove 31. In the engaging structure, at least one bump 536 is disposed at the top surface 534 and at least one corresponding recess 312 is formed in the inner top surface 311, or at least one recess is formed in the top surface 534 and at least one bump (not shown) is formed on the inner top surface.

Figure 9:
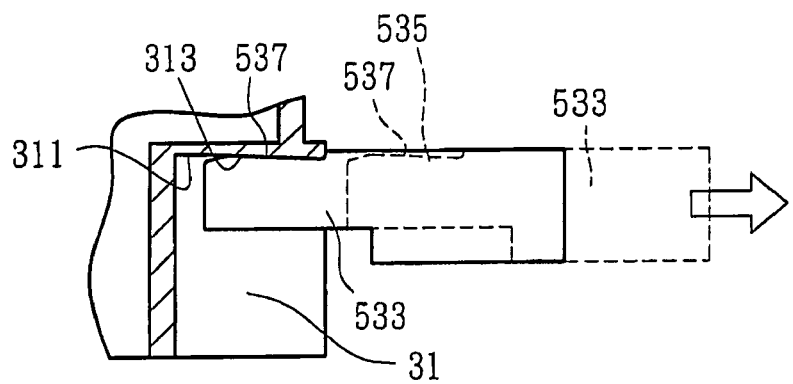
FIG. 9 is a schematic view of fastening the lateral flange and the contact face of the groove to form the bevel face in the clean container of the fastening structure according to the present invention.
Figure 10:
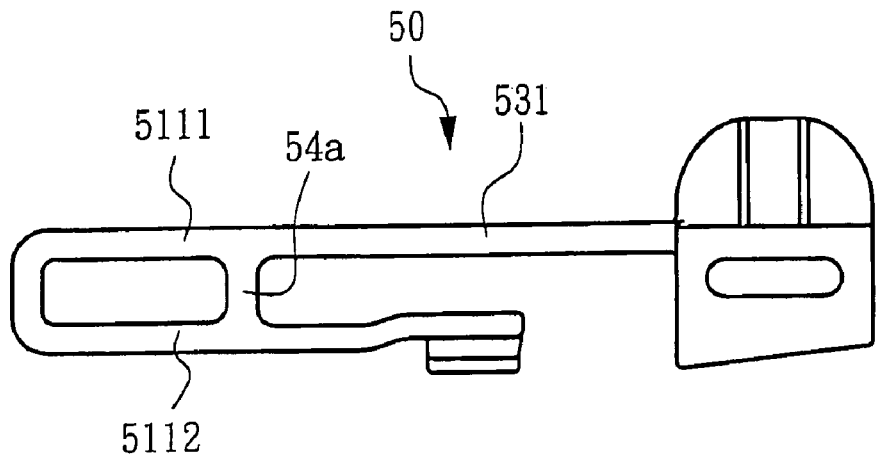
FIG. 10 is a schematic view of a second embodiment of the elastic auxiliary arm of the fastening structure of the clean container according to the present invention.

FIG. 9 is a schematic diagram of fastening the lateral flange and the contact surface of the groove to form the bevel face of the fastening structure of the clean container according to an embodiment of the present invention. With regard to the design of the buckling structure of the lateral flange 533 and the groove 31, the inner top surface 311 of the groove 31 can also be designed as a bevel face 313. The bevel face 313 rises inwards gradually, so as to form a state that the opening sectional area is narrow and the inner sectional area is large. Furthermore, the top surface 534 of the lateral flange 533 is a bevel face 537 corresponding to the inner top surface 311, similar to the design that the two bevel faces 313 and 537 are engaged into each other. After the lateral flange 533 is inserted into the groove 31, a great frictional force is generated when the two components are separated, so as to realize the self-locking function.

In addition, FIGS. 10 to 15 are schematic views of the elastic auxiliary arm of the fastening structure of the clean container according to various embodiments of the present invention. As for the second embodiment of the elastic auxiliary arm shown in FIG. 10, the elastic auxiliary arm 54a is perpendicular to the first frame 5111 (or the elastic arm 531) and the second frame 5112.

Figure 11:
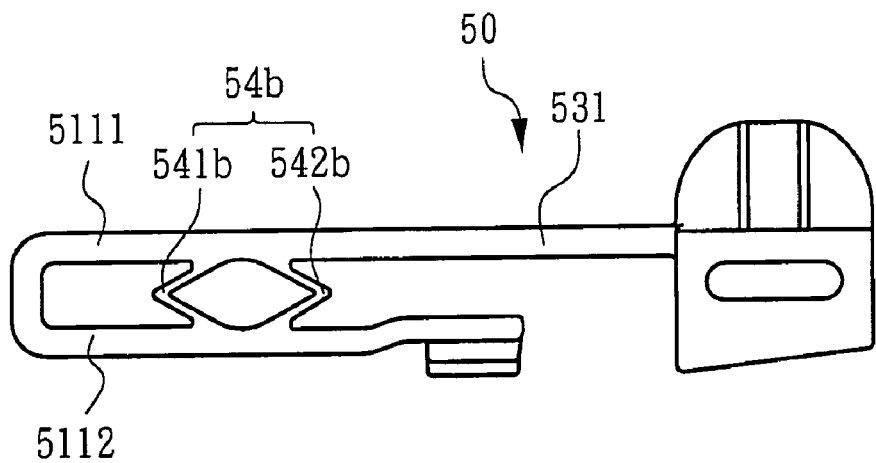
FIG. 11 is a schematic view of a third embodiment of the elastic auxiliary arm of the fastening structure of the clean container according to the present invention.

As for a third embodiment of the elastic auxiliary arm shown in FIG. 11, the elastic auxiliary arm 54b has a first support arm 541b and a second support arm 542b formed between the first frame 5111 (or the elastic arm 531) and the second frame 5112, and the first support arm 541b and the second support arm 542b are approximately L-shaped structures, and are corresponding to each other.

Figure 12:
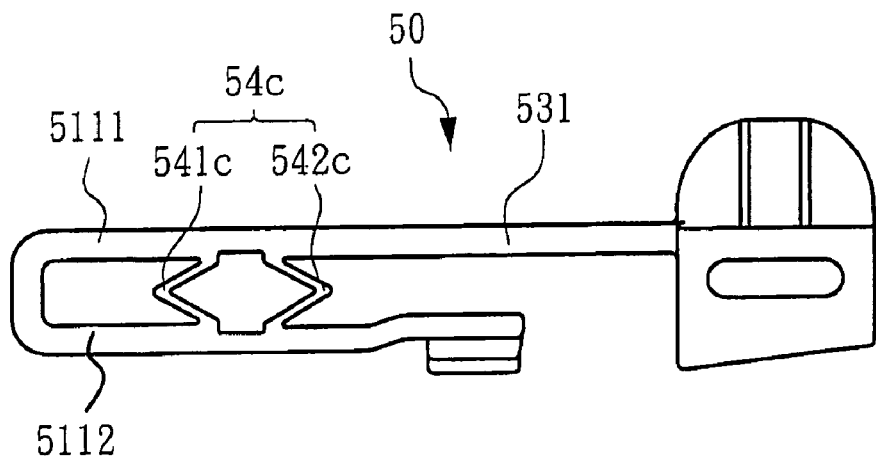
FIG. 12 is a schematic view of a fourth embodiment of the elastic auxiliary arm of the fastening structure of the clean container according to the present invention.

As for a fourth embodiment of the elastic auxiliary arm shown in FIG. 12, the elastic auxiliary arm 54c is similar to the elastic auxiliary arm 54b of third embodiment in respect of the structure and connection relationship, while only the roots of the first support arm 541c and the second support arm 542c are reduced.

Figure 13:
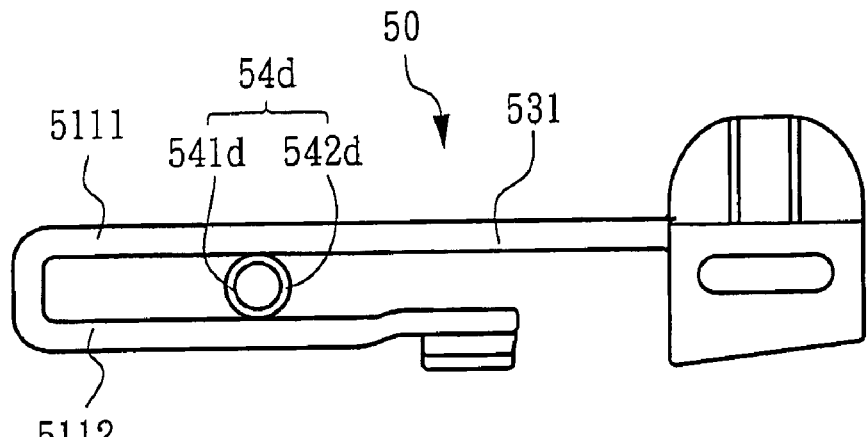
FIG. 13 is a schematic view of a fifth embodiment of the elastic auxiliary arm of the fastening structure of the clean container according to the present invention.

As for a fifth embodiment of the elastic auxiliary arm shown in FIG. 13, the elastic auxiliary arm 54d has a first support arm 541d and a second support arm 542d formed between the first frame 5111 (or the elastic arm 531) and the second frame 5112, and the first support arm 541d and the second support arm 542d are semicircular structures that corresponding to each other, and are connected together.

Figure 14:
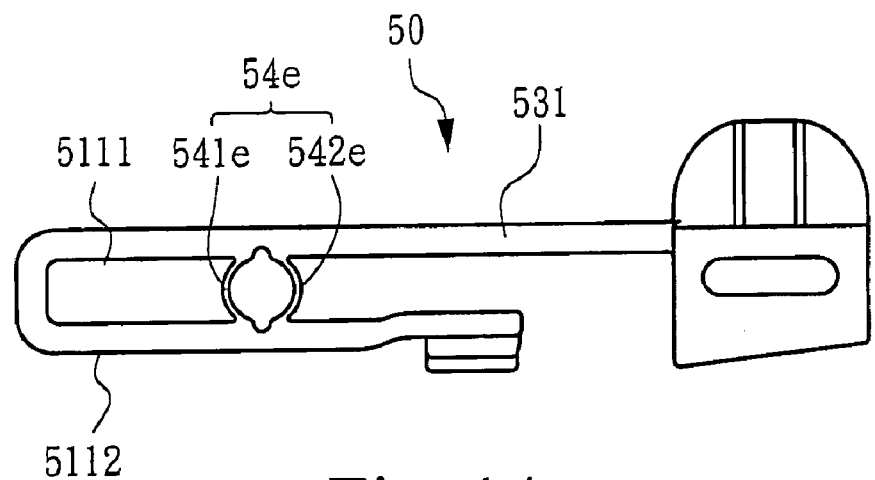
FIG. 14 is a schematic view of a sixth embodiment of the elastic auxiliary arm of the fastening structure of the clean container according to the present invention.

As for a sixth embodiment of the elastic auxiliary arm shown in FIG. 14, the elastic auxiliary arm 54e is similar to the elastic auxiliary arm 54d in the fifth embodiment in respect of the structure and connection relationship, while only the roots of the first support arm 541e and the second support arm 542e are reduced.

Figure 15:
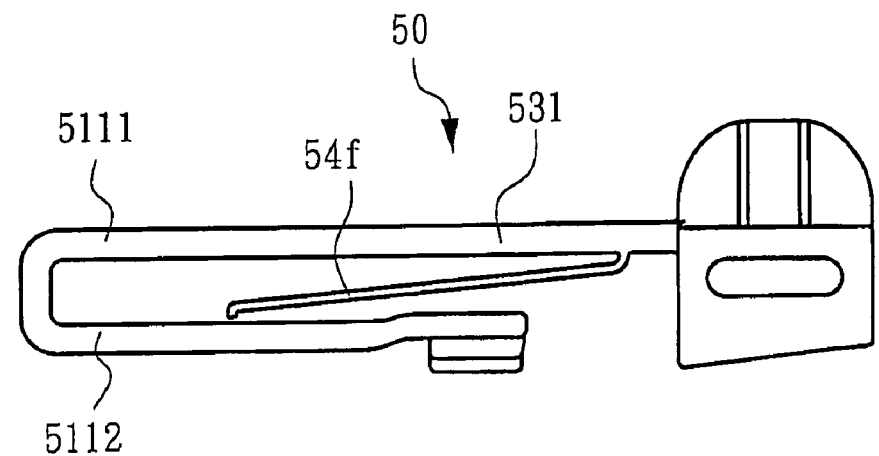
FIG. 15 is a schematic view of a seventh embodiment of the elastic auxiliary arm of the fastening structure of the clean container according to the present invention.

As for a seventh embodiment of the elastic auxiliary arm shown in FIG. 15, the elastic auxiliary arm 54f extends from the elastic arm 531 to the second frame 5112 slantways, and is close to the second frame.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fastening structure of a clean container, removably combined on a cover of the clean container through at least one fastener member, such that the cover is closed or opened on a base of the clean container, wherein a side face of an outer frame of the base has at least one groove, a side face of the cover has an internal plate and an external plate extending outwards to cover the outer frame of the base, at least one accommodation groove is formed between the internal plate and the external plate to engage the fastener member, a hole corresponding to the groove is formed in the internal plate of the accommodation groove, and a positioning hole and a socket corresponding to the hole are formed in the external plate of the accommodation groove, and the fastener member comprises:
   a body;
   a positioning portion, formed on one side of the body, wherein the positioning portion has a flat spring tilting outward, a flange is formed on the flat spring, and the flange is corresponding to the positioning hole of the external plate of the cover and is buckled with the positioning hole; and
   an elastic fastening arm, formed on other side of the body corresponding to the positioning portion, wherein the elastic fastening arm has an elastic arm and a drawing block formed on one end of the elastic arm, the drawing block has a lateral flange, and the lateral flange passes through the hole to extend into the groove, such that a top surface of the lateral flange is buckled with an inner top surface of the groove in the outer frame of the base.

2. The fastening structure of a clean container as claimed in claim 1, wherein the body is a U-shaped frame body, and comprises a first frame and a second frame, the elastic fastening arm extends from the first frame, and the positioning portion extends from the second frame.

3. The fastening structure of a clean container as claimed in claim 2, wherein the positioning portion has a flat spring tilting outwards, and the flange is disposed on the flat spring.

4. The fastening structure of a clean container as claimed in claim 3, wherein the inner top surface of the groove and the top surface towards the flange are further has at least one engaging structure.

5. The fastening structure of a clean container as claimed in claim 4, wherein the engaging structure includes at least one bump disposed on the top surface of the lateral flange and at least one corresponding recess formed in the inner top surface of the groove, or includes at least one recess formed in the top surface of the lateral flange and at least one corresponding bump formed on the inner top surface of the groove.

6. The fastening structure of a clean container as claimed in claim 1, wherein the fastener member further comprises an elastic auxiliary arm formed between the elastic arm and the second frame.

7. The fastening structure of a clean container as claimed in claim 6, wherein at least one end of the elastic auxiliary arm is connected to the elastic arm or the second frame.

8. The fastening structure of a clean container as claimed in claim 6, wherein the elastic auxiliary arm is perpendicular to or inclined relative to the elastic arm.

9. The fastening structure of a clean container as claimed in claim 6, wherein the elastic auxiliary arm comprises a first support arm and a second support arm.

10. The fastening structure of a clean container as claimed in claim 9, wherein the first support arm and/or the second support arm is arc-shaped.

11. The fastening structure of a clean container as claimed in claim 9, wherein the first support arm and the second support arm are L-shaped structures, and are corresponding to each other.

12. The fastening structure of a clean container as claimed in claim 9, wherein the first support arm and the second support arm are semicircle shaped, and are corresponding to each other.

13. The fastening structure of a clean container as claimed in claim 6, wherein the elastic auxiliary arm is perpendicular to the first frame and the second frame.

14. The fastening structure of a clean container as claimed in claim 6, wherein the elastic auxiliary arm extends from the elastic auxiliary arm to the second frame slantways, and is close to the second frame.

15. The fastening structure of a clean container as claimed in claim 1, wherein a top surface of the lateral flange on the elastic fastening arm has at least one rib.

16. The fastening structure of a clean container as claimed in claim 1, wherein the inner top surface of the groove of the base rises inwards gradually, so as to form a bevel face that has a small opening sectional area and a large inner sectional area, and the top surface of the lateral flange is corresponding to the bevel face of the inner top surface.

17. The fastening structure of a clean container as claimed in claim 16, wherein the inner top surface of the groove and the top surface towards the flange are further has at least one engaging structure.

18. The fastening structure of a clean container as claimed in claim 17, wherein the engaging structure includes at least one bump disposed on the top surface of the lateral flange and at least one corresponding recess formed in the inner top surface of the groove, or includes at least one recess formed in the top surface of the lateral flange and at least one corresponding bump formed on the inner top surface of the groove.

19. The fastening structure of a clean container as claimed in claim 1, wherein the accommodation groove further comprises at least one positioning rib, so as to engage and position the U-shaped frame body in the accommodation groove.

20. The fastening structure of a clean container as claimed in claim 19, wherein the U-shaped frame body further comprises at least one positioning rib tube, through which the positioning rib passes.

21. The fastening structure of a clean container as claimed in claim 1, wherein the clean container is a mask storage box, a reticle storage box, a wafer storage box, or a glass substrate storage box.

* * * * *